United States Patent [19]

Rathbone et al.

[11] 4,110,779
[45] Aug. 29, 1978

[54] HIGH FREQUENCY TRANSISTOR

[75] Inventors: Ronald Rathbone, Taukfirchen; Ulrich Schwabe, Munich, both of Germany

[73] Assignee: Siemens Aktiengesellschaft, Berlin & Munich, Germany

[21] Appl. No.: 749,609

[22] Filed: Dec. 13, 1976

[30] Foreign Application Priority Data

Feb. 12, 1976 [DE] Fed. Rep. of Germany ....... 2605641

[51] Int. Cl.² ............................................. H01L 29/72
[52] U.S. Cl. ....................................... 357/34; 357/35; 357/49; 357/55; 357/89; 357/91
[58] Field of Search ....................... 357/34, 49, 35, 91, 357/55, 89

[56] References Cited

U.S. PATENT DOCUMENTS

| 3,933,540 | 1/1976 | Kondo et al. | 357/49 |
| 4,005,453 | 1/1977 | Le Can et al. | 357/49 |
| 4,008,107 | 2/1977 | Mayasaka et al. | 357/49 |

OTHER PUBLICATIONS

W. J. Evans, "Oxide Isolated Low-implanted Bipolar Transistors for High Packing Density and Low Power-Delay Product," *Digest of Technical Papers of the 1973 IEEE International Solid-State Circuits Conference,* Philadelphia, Pa., (Feb. 14-16, 1973), pp. 174-175.

*Primary Examiner*—Stanley D. Miller, Jr.
*Assistant Examiner*—James W. Davie
*Attorney, Agent, or Firm*—Hill, Gross, Simpson, Van Santen, Steadman, Chiara & Simpson

[57] ABSTRACT

A high-frequency transistor is provided having a small effective emitter width and a low base bulk resistance. The transistor is isolated from adjacent components by insulating material portions. The base zone comprises first and second doped zones. The first zone establishes the effective emitter width and has a lower concentration than the second zone. The lateral extent of the first zone is established by one of the insulating material portions and the second zone of the base zone. The collector of the transistor is positioned beneath both the first and second zones of the base zone and the emitter of the transistor is positioned above the first zone and an end portion of the second zone.

6 Claims, 4 Drawing Figures

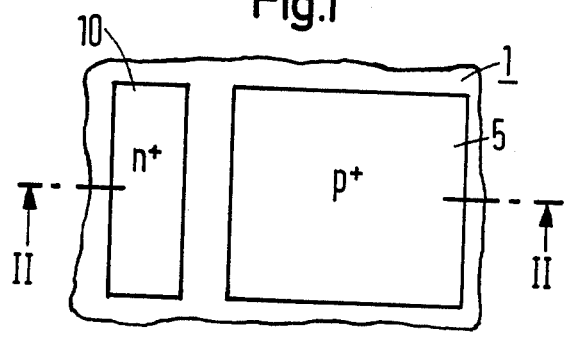
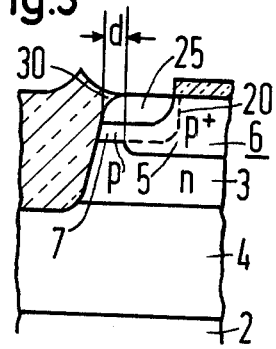
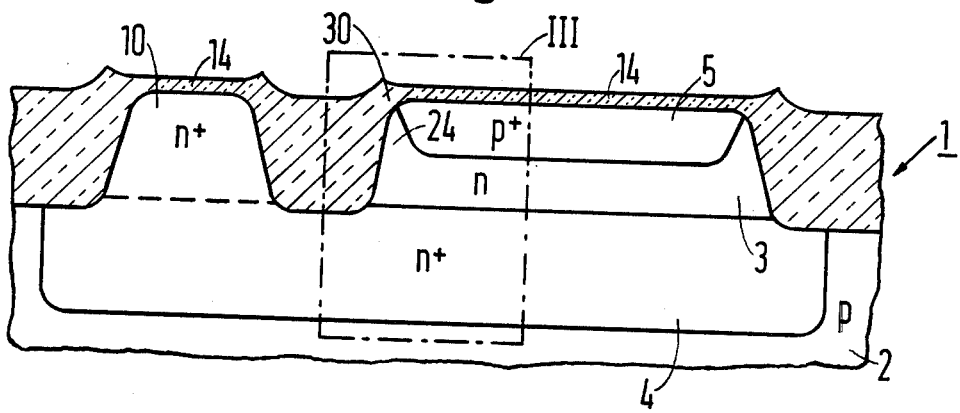
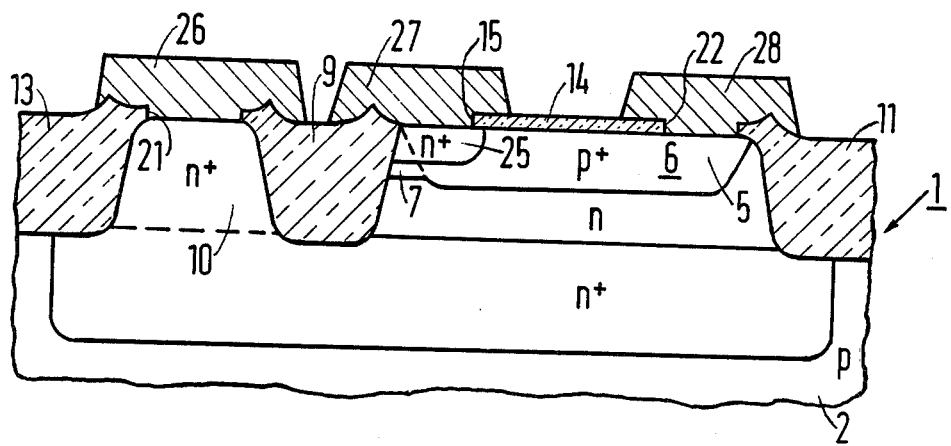

HIGH FREQUENCY TRANSISTOR

BACKGROUND OF THE INVENTION

1. Field of the Invention

The invention relates to a high frequency transistor having a small emitter width and a low base bulk resistance, which, in a semiconductor body is electrically insulated from adjacent components by oxide layers.

2. Description of the Prior Art

In order to achieve as high as possible a degree of integration in integrated circuits, frequently high frequency transistors having a small emitter width and a small base bulk resistance are required. Usually, the minimum emitter width is determined by the lower limit values which can be attained with photo-lacquer- and etching-techniques. Furthermore, the base bulk resistance can be reduced by implanting a stepped profile (IEEE Transactions on Electron Devices, Vol. ED 21 No. 4, April 1974, pages 273-278).

As is known, the oxide insulation technique has the advantage that no insulating tubs with lateral insulation diffusions are required in order to electrically isolate a component from an adjacent component. Thus a higher degree of integration can be achieved with the oxide insulation technique.

SUMMARY OF THE INVENTION

It is an object of this invention to provide a high-frequency transistor which has the least possible emitter width and a small base bulk resistance, and which exploits the advantages of the oxide insulation and photo-lacquer etching techniques.

This object is realized in accordance with the invention by providing a base zone which consists of two differently doped zones wherein one of these zones establishes the effective emitter width.

A further development of the invention consists in that the zone which establishes the effective emitter width consists of a region between an oxide layer and the other zone of the base zone.

In the invention, the base zone is preferably broken down into a p doped, active base zone and preferably a p+ highly doped inactive base zone. The inactive base zone is bounded by a "beak-shaped" region which is formed during the oxidation of the insulating oxide layers. It is in this region that the zone which is doped oppositely to the base zone runs obliquely upwards to the surface of the semiconductor body. Thus, between the inactive, highly-doped base zone and the oxide layer there exists an oppositely doped region whose width represents the effective emitter width. In this way, emitter widths from 0.1 to 0.5 $\mu$m can be produced independently of photo-technical processes. Also the inactive base zone reduces the base bulk resistance.

In the production of the high-frequency transistor of the invention first the emitter window is opened and the active base zone is produced by ion implantation. This active base zone is bounded on the one side by the oxide layer and on the other side by the inactive base zone. This provides a self-adjustment.

The emitter zone can either be implanted or diffused with arsenic or phosphorus.

BRIEF DESCRIPTION OF THE DRAWINGS

FIG. 1 is a plan view of the high-frequency transistor in accordance with the invention;

FIG. 2 is a cross-sectional view taken along line II—II of the high-frequency transistor in FIG. 1;

FIG. 3 shows a side view of the portion III of the high-frequency transistor of FIG. 2 following the implantation of the active base zone; and FIG. 4 is a side view of the high frequency transistor in accordance with the invention.

DESCRIPTION OF THE PREFERRED EMBODIMENTS

FIG. 1 schematically illustrates a plan view of a high-frequency transistor in accordance with the invention. Arranged in a semiconductor body 1 with silicon dioxide layers 9, 11, 13 and silicon dioxide films 14 are a p+ doped base zone 5 and a n+ doped zone 10. The semiconductor body 1 consists of a p doped substrate wafer 2 having a specific resistance of 0.5 Ohm-cm and a (100) structural orientation. Arranged on the substrate wafer 2 is a 2.5 $\mu$m thick, n doped epitaxial layer 3 having a specific resistance of 0.8 Ohm-cm. Prior to the deposition of the epitaxial layer 3, a n+ doped buried layer 4 having a penetration depth of 4 $\mu$m and a layer resistance of 25 Ohm/□ is formed by doping with antimony in the substrate wafer 2. Then pits are introduced into the epitaxial layer 3 by etching to a depth of approximately 1.5 $\mu$m. As a result of insulation oxidation, then oxide layers 9, 11, and 13 having a layer thickness of approximately 2 $\mu$m are formed in the pits. During the oxidation of these oxide layers 9, 11 and 13, a beak-shaped zone 30 is formed along the side walls thereof. The base zone 5 is produced by diffusion and has a layer resistance of 30 to 500 Ohm/□ (preferably 300 Ohm/□). In addition, the zone 10 is produced by diffusion.

An emitter window 15 is introduced into the silicon dioxide film 14 formed on the zone 5. Then an active base zone 7 is implanted by ion implantation with an implantation energy of 20 to 150 keV, (preferably 80 keV), and a dose of $10^{12}$ to $10^{14}$ (preferably $10^{13}$). The outline of this active base zone 7 is indicated by a broken line 20 in FIG. 3.

Subsequently the emitter zone 25 is produced by diffusion or implantation. The effective emitter width d here is determined by the width of the n doped zone 24 (see FIG. 2) and the penetration depth of the emitter diffusion. In this way it is possible to produce emitter widths of 0.1 to 0.5 $\mu$m with the aid of conventional photo-lacquer and etching techniques.

Finally a collector contact 26, an emitter contact 27, and a base contact 28 are formed in the window 15 and in the further windows 21 and 22. The zone 10, the buried layer 4, and the epitaxial layer 3 form the collector zone. The base zone 6 consists of the p+ highly-doped inactive base zone 5 and the p doped active base zone 7.

Thus, in the invention the lateral extent of the inactive base zone 5 is determined by the geometry of the beak-shaped zone 30 which latter is formed during the insulation oxidation for the oxide layers 9, 11 and 13. Between the inactive base zone 5 and the oxide layer 9 remains the n doped zone 24 whose width represents the effective emitter width.

The active base zone 7 is implanted after the emitter window 15 has been opened. This zone is bounded on the one side by the inactive base zone 5 and on the other side by the oxide layer 9.

Although various minor modifications may be suggested by those versed in the art, it should be understood that we wish to embody within the scope of the patent warranted hereon, all such embodiments as reasonably and properly come within the scope of our contribution of the art.

We claim as our invention:

1. A high-frequency transistor structure adapted for providing a small effective emitter width and a low base bulk resistance, comprising:

a semiconductor body of first conductivity type;

a collector zone of second conductivity type formed on the semiconductor body;

a base zone of first conductivity type above the collector zone;

an emitter zone of second conductivity type above a portion of the base zone;

insulating material to one side of the emitter and base zones;

said base zone comprising a first ion implanted doped zone and a second diffused doped zone, said first zone having a doping concentration lower than said second zone, said first zone establishing the effective emitter width and being formed between the emitter and collector zones and also between said insulating material on one side and the base second zone on the entire opposite side; and said emitter zone overlies and is in contact with the base first zone and overlies and is in contact with a portion of the base second zone.

2. A high-frequency transistor as claimed in claim 1 characterized in that the first zone is implanted with an implantation energy of 20 to 150 keV and a dose of $10^{12}$ to $10^{14}$.

3. A high-frequency transistor as claimed in claim 1 characterized in that the second zone has a layer resistance of 30 to 500 Ohm/□.

4. A high-frequency transistor as claimed in claim 3 in which said second zone layer resistance is approximately 300 Ohm/□.

5. A high-frequency transistor as claimed in claim 1 in which the implantation energy is approximately 80 keV and a dosage of approximately $10^{13}$.

6. A structure according to claim 1 in which a layer of second conductivity type and concentration relatively higher than said collector zone is formed in said semiconductor body and contiguous with said collector zone.

* * * * *